(12) United States Patent
Kato et al.

(10) Patent No.: US 9,147,804 B2
(45) Date of Patent: Sep. 29, 2015

(54) NITRIDE SEMICONDUCTOR LIGHT-EMITTING ELEMENT AND LIGHT SOURCE INCLUDING THE NITRIDE SEMICONDUCTOR LIGHT-EMITTING ELEMENT

(71) Applicant: Panasonic Corporation, Osaka (JP)

(72) Inventors: Ryou Kato, Osaka (JP); Kunimasa Takahashi, Osaka (JP); Masaki Fujikane, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 67 days.

(21) Appl. No.: 14/029,039

(22) Filed: Sep. 17, 2013

(65) Prior Publication Data

US 2014/0014997 A1    Jan. 16, 2014

Related U.S. Application Data

(63) Continuation of application No. PCT/JP2013/001159, filed on Feb. 27, 2013.

(30) Foreign Application Priority Data

Feb. 28, 2012    (JP) .................... 2012-041414

(51) Int. Cl.
*H01L 33/20* (2010.01)
*H01L 33/32* (2010.01)
(Continued)

(52) U.S. Cl.
CPC .............. *H01L 33/20* (2013.01); *H01L 33/025* (2013.01); *H01L 33/16* (2013.01); *H01L 33/32* (2013.01);
(Continued)

(58) Field of Classification Search
CPC ........................................................ H01L 33/20
USPC ............................................................ 257/98
See application file for complete search history.

(56) References Cited

U.S. PATENT DOCUMENTS 5,693,963 A    12/1997 Fujimoto et al.
2008/0179623 A1    7/2008 Tachibana et al.
(Continued)

FOREIGN PATENT DOCUMENTS

JP    2004-363251 A    12/2004
JP    2005-085932 A    3/2005
(Continued)

OTHER PUBLICATIONS

Kim et al. III—nitride ultraviolet light emitting diodes with delta doping, Jul. 2003, Applied Physics Letters, vol. 83, No. 3, pp. 566-568.*

(Continued)

*Primary Examiner* — Matthew W Such
*Assistant Examiner* — Warren H Kilpatrick
(74) *Attorney, Agent, or Firm* — Renner, Otto, Boisselle & Sklar, LLP

(57) ABSTRACT

A nitride semiconductor light-emitting element includes: n-side and p-side electrodes; n-type and p-type nitride semiconductor layers; and an active layer arranged between the n- and p-type nitride semiconductor layers. The p-type nitride semiconductor layer has a projection having a height of 30 nm to 50 nm. The projection is formed of a p-type nitride semiconductor including magnesium and silicon. The p-type nitride semiconductor has a silicon concentration of $1.0 \times 10^{17}$ $cm^{-3}$ to $6.0 \times 10^{17}$ $cm^{-3}$. The projection projects from the active layer toward the p-side electrode. On a plan view of the nitride semiconductor light-emitting element, the p-side electrode overlaps with the projection. The projection includes a dislocation. The projection is surrounded with a flat surface which is formed of the p-type nitride semiconductor. And the projection has a higher dislocation density than the flat surface.

13 Claims, 10 Drawing Sheets

(51) Int. Cl.
*H01L 33/02* (2010.01)
*H01L 33/16* (2010.01)
*H01L 33/22* (2010.01)
*H01L 33/40* (2010.01)
*H01L 21/02* (2006.01)

(52) U.S. Cl.
CPC ......... *H01L 21/0237* (2013.01); *H01L 21/0254* (2013.01); *H01L 21/0262* (2013.01); *H01L 21/02458* (2013.01); *H01L 21/02576* (2013.01); *H01L 33/22* (2013.01); *H01L 33/325* (2013.01); *H01L 33/40* (2013.01)

(56) References Cited

U.S. PATENT DOCUMENTS

| | | |
|---|---|---|
| 2010/0155704 A1 | 6/2010 | Oh et al. |
| 2010/0187495 A1 | 7/2010 | Yoon et al. |
| 2010/0219426 A1* | 9/2010 | Kim et al. ............ 257/88 |
| 2010/0230690 A1 | 9/2010 | Kyono et al. |
| 2010/0240161 A1 | 9/2010 | Kamikawa et al. |
| 2011/0309400 A1 | 12/2011 | Fukushima et al. |
| 2013/0032810 A1* | 2/2013 | Chen ............ 257/76 |

FOREIGN PATENT DOCUMENTS

| | | |
|---|---|---|
| JP | 2005-251922 A | 9/2005 |
| JP | 2007-095744 A | 4/2007 |
| JP | 2007-095745 A | 4/2007 |
| JP | 2007-266401 A | 10/2007 |
| JP | 2008-034754 A | 2/2008 |
| JP | 2008-182069 A | 8/2008 |
| JP | 2009-049179 A | 3/2009 |
| JP | 4375497 B | 9/2009 |
| JP | 2010-153838 A | 7/2010 |
| JP | 2010-205988 A | 9/2010 |
| JP | 2010-219376 A | 9/2010 |
| JP | 2010-534933 T | 11/2010 |
| JP | 2011-211050 A | 10/2011 |

OTHER PUBLICATIONS

Chang et al. InGaN/Gan Light Emitting Diodes with a P-Down Structure, Aug. 2002, IEEE Transactions on Electron Devices, vol. 29 No. 8, pp. 1361-1365.*
International Search Report for corresponding International Application No. PCT/JP2013/001159 mailed Mar. 26, 2013.
Hirai et al., "Formation and reduction of pyramidal hillocks on *m*-plane [1100] GaN", Applied Physics Letters, vol. 91 191906 (2007) (cited in [0058] of the specification).

* cited by examiner

*FIG.3*
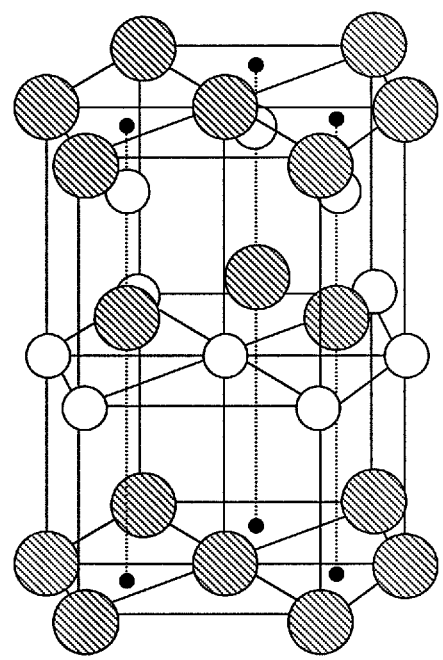
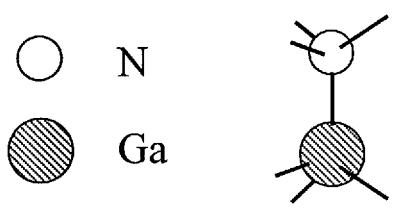

FIG.8A    FIG.8B
 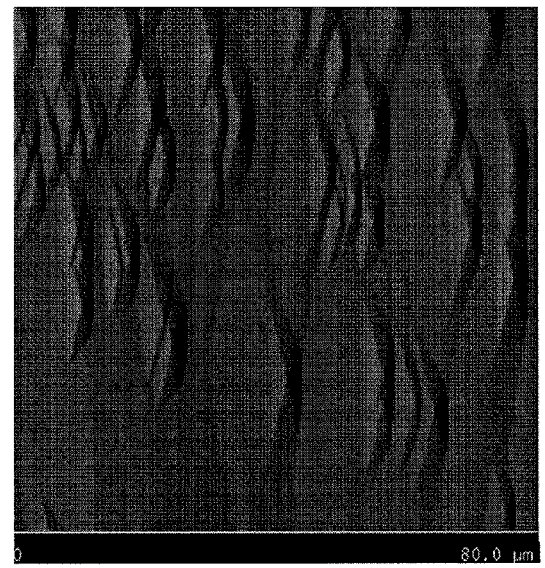
FIG.9
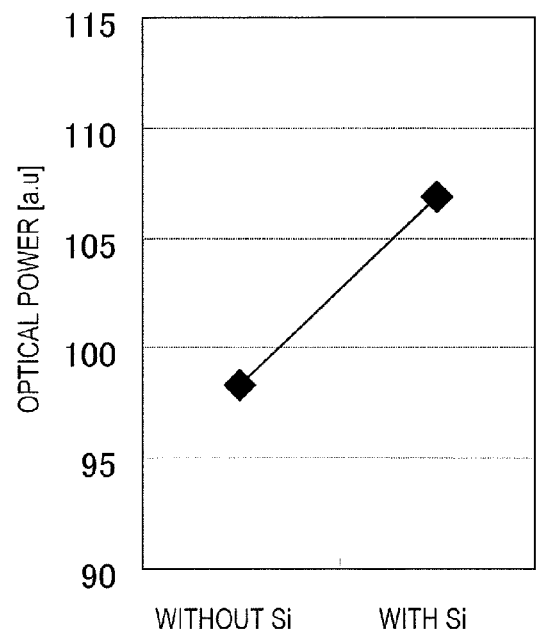

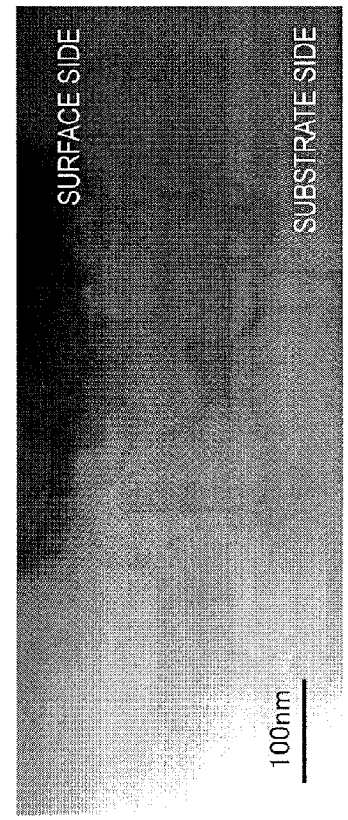
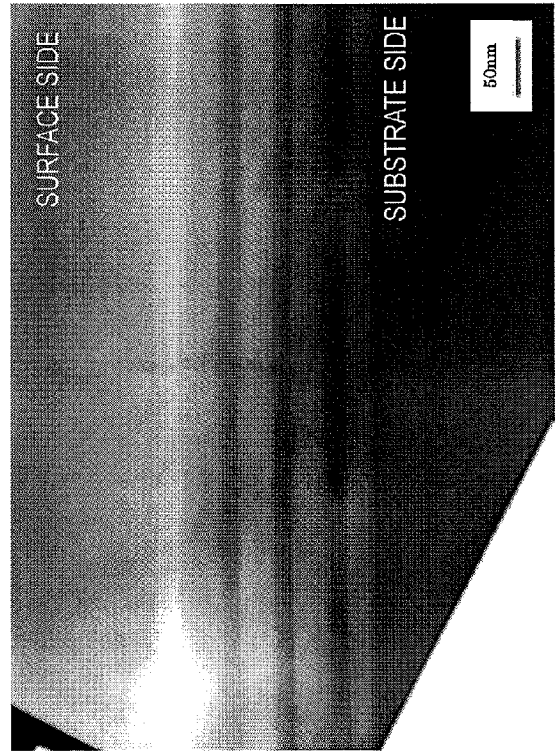

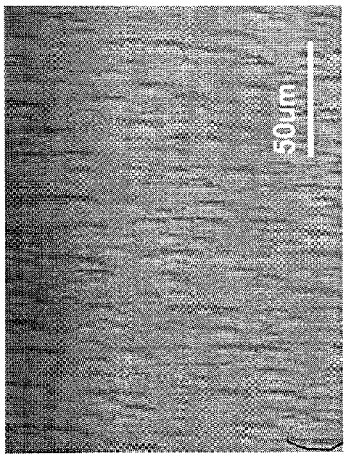
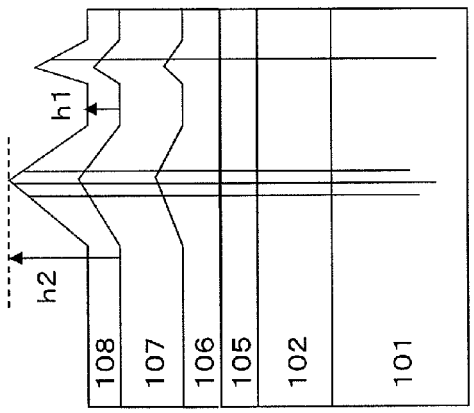
FIG.11C
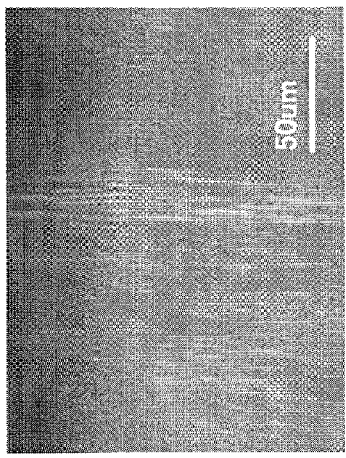
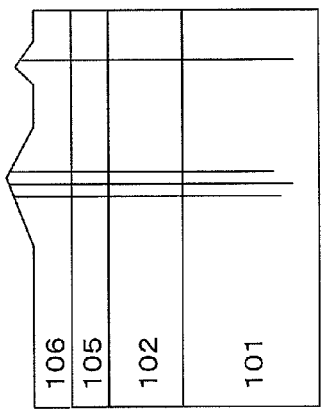
FIG.11B
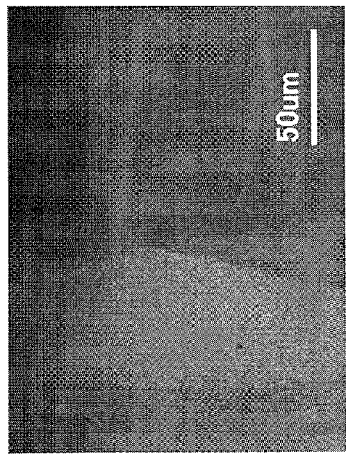
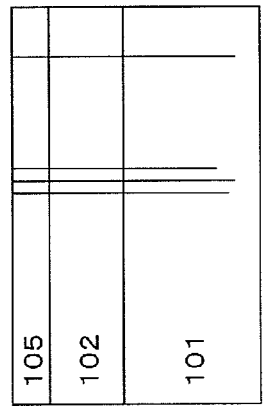
FIG.11A

NITRIDE SEMICONDUCTOR LIGHT-EMITTING ELEMENT AND LIGHT SOURCE INCLUDING THE NITRIDE SEMICONDUCTOR LIGHT-EMITTING ELEMENT

This is a continuation of International Application No. PCT/JP2013/001159, with an international filing date of Feb. 27, 2013, which claims priority of Japanese Patent Application No. 2012-041414, filed on Feb. 28, 2012, the contents of which are hereby incorporated by reference.

BACKGROUND

1. Technical Field

The present application relates to a nitride semiconductor light-emitting element including a non-polar or semi-polar semiconductor layer and also relates to a light source including such a nitride semiconductor light-emitting element.

2. Description of the Related Art

A nitride semiconductor including nitrogen (N) as a Group V element is a prime candidate for a material to make a short-wave light-emitting element, because its bandgap is sufficiently wide. Among other things, nitride semiconductors have been researched particularly extensively. As a result, blue-ray-emitting light-emitting diodes (LEDs), green-ray-emitting LEDs and blue-ray-emitting semiconductor laser diodes, each of which uses a nitride semiconductor, have already been used in actual products.

A nitride semiconductor is represented by the general formula $Al_xGa_yIn_zN$ (where $0 \leq x$, $z<1$, $0<y \leq 1$ and $x+y+z=1$).

By replacing Ga with Al, the bandgap of a nitride semiconductor can be made larger than that of GaN. By replacing Ga with In, the bandgap of a nitride semiconductor can be made smaller than that of GaN. As a result, not only short-wave light rays such as a blue or green light ray but also long-wave light rays such as an orange or red light ray can be emitted as well. Due to these features, such nitride semiconductor light-emitting elements are expected to be used to image display devices and illumination units, for example.

A nitride semiconductor has a wurtzite crystal structure. FIG. 1 and FIGS. 2A through 2D illustrate the plane orientations of a wurtzite crystal structure which are indicated by four indices (i.e., hexagonal indices). According to the four index notation, a crystal plane or orientation is represented by four primitive vectors $a_1$, $a_2$, $a_3$ and c as shown in FIG. 1. The primitive vector c runs in the direction, which is called a "c-axis". A plane that intersects with the c-axis at right angles is called either a "c-plane" or a "(0001) plane" as shown in FIG. 2A. FIGS. 2B through 2D show an m-plane (=(10-10) plane), an a-plane (=(11-20) plane), and an r-plane (=(10-12) plane), respectively. In this description, "−" attached on the left-hand side of a Miller-Bravais index in the parentheses means a "bar" (a negative direction index) for convenience sake.

FIG. 3 illustrates the crystal structure of a nitride semiconductor according to a ball-stick model. FIG. 4A is a ball-stick model illustrating the arrangement of atoms in the vicinity of the m-plane surface as viewed in the a-axis direction. The m-plane crosses at right angles the paper on which FIG. 4A is drawn. On the other hand, FIG. 4B is a ball-stick model illustrating the arrangement of atoms on the +c-plane surface as viewed in the m-axis direction. The c-plane crosses at right angles the paper on which FIG. 4B is drawn. As can be seen from FIG. 3 and FIG. 4A, N atoms and Ga atoms are present on a plane that is parallel to the m-plane. On the other hand, as can be seen from FIG. 3 and FIG. 4B, a layer in which only Ga atoms are arranged and a layer in which only N atoms are arranged are formed on the c-plane.

In the related art, in fabricating a semiconductor element using nitride based semiconductors, a c-plane substrate, i.e., a substrate of which the principal surface is a (0001) plane, is used as a substrate on which nitride semiconductor crystals will be grown. In that case, due to the arrangement of Ga atoms and the arrangement of N atoms, spontaneous electrical polarization is produced in a nitride semiconductor. That is why the "c-plane" is also called a "polar plane". As a result, a piezoelectric field is generated in the c-axis direction in the InGaN quantum well that forms the light-emitting layer of a nitride semiconductor light-emitting element. Then, the piezoelectric field generated causes some positional deviation in the distributions of electrons and holes in the light-emitting layer. Consequently, due to the quantum confinement Stark effect of carriers, the internal quantum efficiency of the light-emitting layer decreases. Thus, to minimize the decrease in the internal quantum efficiency of the light-emitting layer, the light-emitting layer to be formed on the (0001) plane is designed to have a thickness of 3 nm or less.

Furthermore, people have recently proposed fabricating a light-emitting element using a substrate, of which the principal surface is either an m-plane or an a-plane (i.e., a so-called "non-polar plane") or an r-plane or a (11-22) plane (i.e., a so-called "semi-polar plane"). As shown in FIGS. 2A through 2D, in the wurtzite crystal structure, the m-plane is parallel to the c-axis, and consists of six equivalent planes that intersect with the c-plane at right angles. For example, the (10-10) plane which intersects with the [10-10] direction at right angles in FIGS. 2A through 2D is an m-plane. The other m-planes equivalent to the (10-10) plane are a (−1010) plane, a (1-100) plane, a (−1100) plane, a (01-10) plane and a (0-110) plane.

As shown in FIGS. 3 and 4A, on the m-plane, Ga atoms and N atoms are on the same atomic plane, and therefore, no electrical polarization will be produced perpendicularly to the m-plane. That is why if a light-emitting element is fabricated using a semiconductor multilayer structure that has been formed on an m-plane, no piezoelectric field will be produced in the light-emitting layer, thus overcoming the problem that the internal quantum efficiency decreases due to the quantum confinement Stark effect of carriers. This can also be said about an a-plane, which is a non-polar plane other than the m-plane. And the same effects can also be achieved even on a −r-plane or a (11-22) plane (i.e., a so-called "semi-polar plane").

SUMMARY

Such a nitride semiconductor light-emitting element, of which the growing plane is a non-polar plane or a semi-polar plane, needs to have its luminous efficacy further increased.

A non-limiting exemplary embodiment of the present application provides a nitride semiconductor light-emitting element and light source which achieve increased luminous efficacy.

In one general aspect, a nitride semiconductor light-emitting element disclosed herein includes: an n-side electrode; a p-side electrode; an n-type nitride semiconductor layer which is electrically connected to the n-side electrode; a p-type nitride semiconductor layer having a principal surface of either a non-polar plane or a semi-polar plane; and an active layer which is arranged between the n- and p-type nitride semiconductor layers. The p-type nitride semiconductor layer has a projection having a height of not less than 30 nm and not more than 50 nm. The projection is formed of a p-type nitride semiconductor containing not only magnesium but also silicon. The p-type nitride semiconductor has a silicon concentration of not less than $1.0\times10^{17}$ cm$^{-3}$ and not more than $6.0\times10^{17}$ cm$^{-3}$. The projection projects from the active layer toward the p-side electrode. On a plan view of the nitride semiconductor light-emitting element, the p-side electrode overlaps with the projection. The projection includes a dislocation. The projection is surrounded with a flat surface which is formed of the p-type nitride semiconductor. And the projection has a higher dislocation density than the flat surface.

A nitride semiconductor light-emitting element according to the above aspect increases the luminous efficacy.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 3 illustrates the crystal structure of a nitride semiconductor according to a ball-stick model.

FIG. 8A is a surface AFM image of a semiconductor sample to which no Si was added.

FIG. 8B is a surface AFM image of a semiconductor sample to which Si was added.

FIG. 9 shows, in comparison, the respective optical powers of a semiconductor sample to which Si was added and another semiconductor sample to which no Si was added when current was injected to them.

FIGS. 10A and 10B are TEM images of dislocations which are related to an embodiment of the present disclosure.

FIGS. 11A, 11B and 11C each show an optical microscope image of the surface of a sample and a schematic cross-sectional view of the sample in a method for fabricating a nitride semiconductor light-emitting element.

DETAILED DESCRIPTION

Figure 1:
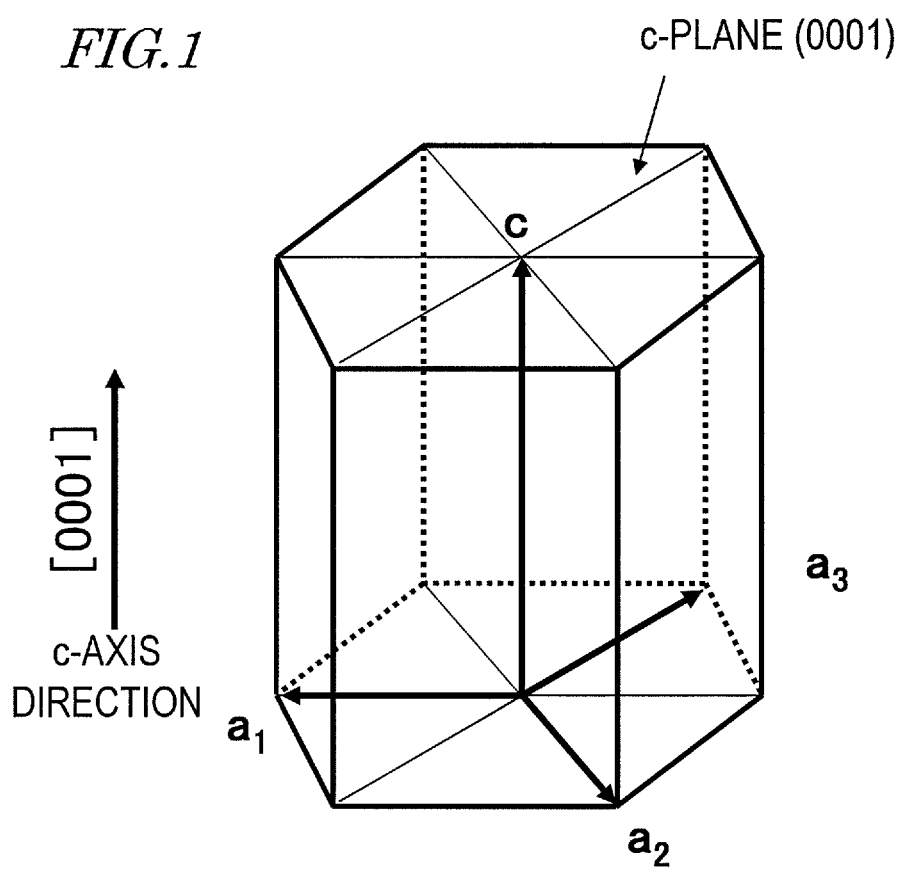
FIG. 1 is a perspective view showing the four primitive translation vectors $a_1$, $a_2$, $a_3$ and c of a wurtzite crystal structure.
Figure 2:
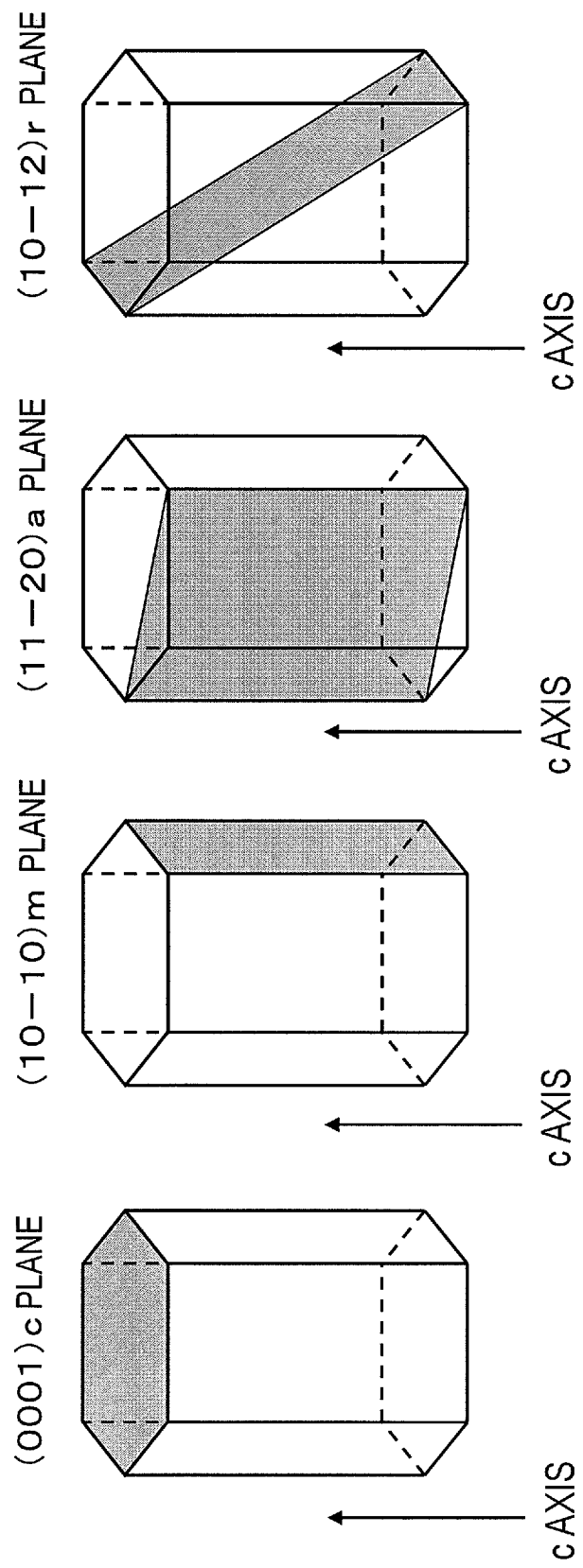
FIGS. 2A through 2D respectively illustrate c, m, a- and r-planes of the crystal structure of a nitride semiconductor.
Figure 4A:
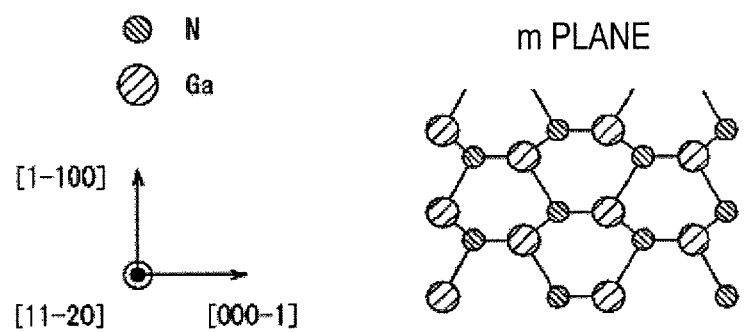
FIG. 4A is a plan view of an m-plane nitride semiconductor.
Figure 4B:
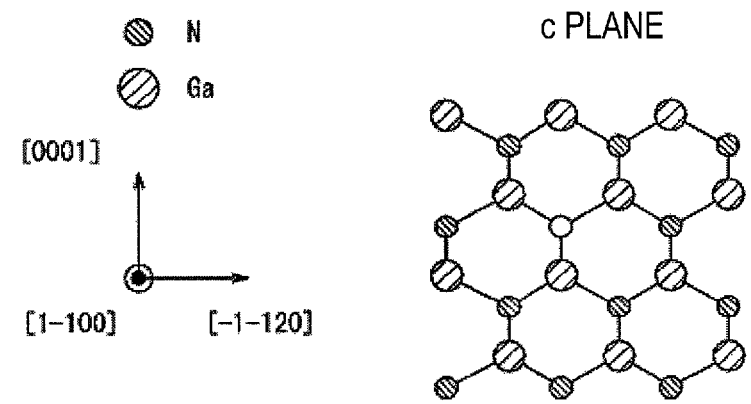
FIG. 4B is a plan view of a c-plane nitride semiconductor.

An aspect of the present disclosure can be outlined as follows:

A nitride semiconductor light-emitting element according to an aspect of the present disclosure includes: an n-side electrode; a p-side electrode; an n-type nitride semiconductor layer which is electrically connected to the n-side electrode; a p-type nitride semiconductor layer having a principal surface of either a non-polar plane or a semi-polar plane; and an active layer which is arranged between the n- and p-type nitride semiconductor layers. The p-type nitride semiconductor layer has a projection having a height of not less than 30 nm and not more than 50 nm. The projection is formed of a p-type nitride semiconductor including not only magnesium but also silicon. The p-type nitride semiconductor has a silicon concentration of not less than $1.0\times10^{17}$ cm$^{-3}$ and not more than $6.0\times10^{17}$ cm$^{-3}$. The projection projects from the active layer toward the p-side electrode. On a plan view of the nitride semiconductor light-emitting element, the p-side electrode overlaps with the projection. The projection includes a dislocation. The projection is surrounded with a flat surface which is formed of the p-type nitride semiconductor. And the projection has a higher dislocation density than the flat surface.

The projection may have a surface area of not less than $5.0\times10^{-7}$ cm$^2$ and not more than $3.8\times10^{-6}$ cm$^2$.

The dislocation density may be not less than $1.0\times10^5$ cm$^{-2}$ and not more than $1.0\times10^7$ cm$^{-2}$.

The p-type nitride semiconductor may have a magnesium concentration of not less than $5.0\times10^{19}$ cm$^{-3}$ and not more than $5.0\times10^{20}$ cm$^{-3}$.

The projection may have a substantially square, substantially rectangular, substantially circular or substantially elliptical cross-sectional shape.

On a plan view, the dislocations may be dispersed, and the dislocations may have a dispersion density of not less than $1.0\times10^5$ cm$^{-2}$ and not more than $1.0\times10^7$ cm$^{-2}$.

The flat surface may have a thickness of not less than 26 nm and not more than 60 nm.

The nitride semiconductor light-emitting element may further include a p-type nitride semiconductor multilayer structure, which may include: a p-type nitride semiconductor electron blocking layer; and a p-type nitride semiconductor contact layer. The p-type nitride semiconductor electron blocking layer may be sandwiched between the active layer and p-type nitride semiconductor contact layer. The p-type nitride semiconductor contact layer may be sandwiched between the p-side electrode and the p-type nitride semiconductor electron blocking layer. The p-type nitride semiconductor electron blocking layer may be the p-type nitride semiconductor layer.

Another p-type nitride semiconductor layer may be sandwiched between the p-type nitride semiconductor electron blocking layer and the p-type nitride semiconductor contact layer.

The p-type contact layer may have a magnesium concentration of not less than $5.0\times10^{19}$ cm$^{-3}$ and not more than $5.0\times10^{20}$ cm$^{-3}$, and the p-type contact layer may have a thickness of not less than 26 nm and not more than 60 nm.

The p-type nitride semiconductor layer may have an Si-doped layer which is located closer to the active layer. The Si-doped layer may have a thickness of not less than 10 nm and not more than 100 nm. And the Si-doped layer may have a silicon concentration of $1.0\times10^{17}$ cm$^{-3}$ to $6.0\times10^{17}$ cm$^{-3}$.

The p-type nitride semiconductor layer may include Al within a range of 100 nm as measured from its end closer to the active layer.

A light source according to an aspect of the present disclosure includes: a nitride semiconductor light-emitting element according to any of the embodiments described above; and a wavelength converting section including a phosphor which converts the wavelength of light emitted from the nitride semiconductor light-emitting element.

Hereinafter, it will be described how the luminous efficacy is improved according to this embodiment.

Generally speaking, if the crystal quality of the quantum well layers (e.g., $In_xGa_{1-x}N$ (where $0<x<1$) layers) of an active layer formed of a nitride semiconductor is improved, the luminous efficacy of a nitride semiconductor light-emitting element (such as an LED) can be improved. However, if there are any dislocations such as threading dislocations, screw dislocations, misfit dislocations and stacking faults in the $In_xGa_{1-x}N$ (where $0<x<1$) layers, then non-radiative centers will be generated at a high density in the vicinity of those dislocations, thus decreasing the LED's efficiency. For that reason, researches have been carried out extensively in order to grow the $In_xGa_{1-x}N$ (where $0<x<1$) layers while generating dislocations are avoided as perfectly as possible.

To reduce the density of dislocations, it is effective to produce homo-epitaxial growth and minimize the lattice mismatch by using a GaN-based self-standing substrate as a substrate to grow an LED structure on. However, as even such a GaN-based self-standing substrate also has those threading dislocations, screw dislocations and other kinds of dislocations originally, those dislocations of the substrate will be inherited to the LED structure to be grown on that substrate. That is why even if the homo-epitaxial growth is produced, it is still difficult to perfectly prevent those non-radiative centers from decreasing the efficiency. Particularly, a GaN-based self-standing substrate, of which the growing plane (i.e., the principal surface) is a non-polar plane or a semi-polar plane, tends to generate such dislocations rather easily. And those threading dislocations, screw dislocations and other dislocations (which are also called "crystal defects") will be present there typically at a density of $1.0\times10^5$ $cm^{-2}$ or more.

It is known that if a hetero-epitaxial growth is produced on a substrate of sapphire or silicon carbide (SiC), threading dislocations, misfit dislocations, and other dislocations will be generated at the interface between the substrate and the LED structure due to a lattice mismatch between the material of the substrate and the nitride semiconductor. That is why in producing a hetero-epitaxial growth, some measure for reducing those crystal defects (e.g., inserting a buffer layer between the substrate and the LED structure) is often taken. Even so, it is still impossible to avoid generating those dislocations perfectly.

The dislocations inherited from the GaN-based self-standing substrate to the LED structure will propagate across the respective layers that form the LED structure substantially perpendicularly to the growing plane (i.e., principal surface). Likewise, the dislocations to be generated between the substrate and the LED structure during the hetero-epitaxial growth will also propagate across the respective layers that form the LED structure substantially perpendicularly to the growing plane (i.e., principal surface). Even though there are various kinds of dislocations including threading dislocations, screw dislocations, misfit dislocations, edge dislocations, mixed dislocations, and stacking faults, all of those dislocations will be collectively referred to herein as "dislocations". As described above, "dislocations" are sometimes called "crystal defects". No matter what kind of dislocations are present, a lot of non-radiative centers should be present around those dislocations.

The dislocations that had something to do with an embodiment of the present disclosure were observed through a TEM (transmission electron microscope) analysis. As a result, the dislocations inherited from the substrate were seen to propagate almost straight to the surface of the LED structure as shown in FIG. 10A. Only with the result shown in FIG. 10A, the decision cannot be made whether defects have occurred discretely by themselves or multiple defects have occurred to be concentrated within a very narrow range. In addition, those defects were also seen to change directions into multiple branches and propagate to the surface while spreading as shown in FIG. 10B.

If the substrate on which the LED structure has been grown is seen from right over it, those defects propagating straight reach the surface and get exposed there as dotted or linear defects as shown in FIG. 10A. On the other hand, those defects propagating along multiple branches reach the surface and get exposed there to cover something of an area as shown in FIG. 10B.

In the following description of embodiments of the present disclosure, no matter how broad an area and what shape those defects have when viewed from right over the substrate on which the LED structure has grown, such an area where those defects are concentrated and a surrounding area where a lot of non-radiative centers have been generated will be referred to herein as a "defective portion". The defective portion refers herein to an area where the threading dislocations, screw dislocations and other dislocations are concentrated and to its surrounding area where a lot of non-radiative centers have been generated. And the defective portion is present perpendicularly to the growing plane (principal surface) across the respective layers that form the LED structure from inside of the substrate that has been used for crystal growth through the top surface of the LED structure where those defects are exposed.

To minimize a decrease in luminous efficacy, the quality of a GaN-based self-standing substrate needs to be improved so as to reduce the dislocations in the case of a homo-epitaxial growth. In the case of a hetero-epitaxial growth, on the other hand, the substrate may be subjected to some patterning in advance so that dislocations generated at the interface of growth are not inherited to the LED structure easily. Even though researches have been carried on extensively to improve the quality of GaN-based self-standing substrates, no innovative technique, by which the density of dislocations can be reduced significantly from the current one, has been reported yet. Also, considering the additional cost and yield, it seems to be difficult to subject the substrate to such patterning in advance.

To overcome these problems, the present inventors attempted to minimize the decrease in luminous efficacy by selectively reducing the injection of current into the dislocations to be inherited from the substrate in the case of the homo-epitaxial growth or the dislocations to be generated in the case of the hetero-epitaxial growth when either a non-polar plane or a semi-polar plane is used as a growing plane (principal surface) and by making a region which is as distant from those dislocations as possible contribute mainly to emitting light. As a result, the present inventors discovered a technique for achieving this object while the cost is minimized. Hereinafter, it will be described exactly how we discovered such a technique.

A p-type nitride semiconductor layer, of which the growing plane (principal surface) is either a non-polar plane or a semi-polar plane, has so large a work function that the semiconductor layer comes to have high contact resistance with the p-side electrode. By providing a p-type contact layer which is heavily doped with a p-type dopant at the top surface where the p-type nitride semiconductor layer contacts with the p-side electrode, the contact resistance can be reduced.

The present inventors discovered that by providing a p-type contact layer including a p-type dopant such as magnesium (Mg) at a relatively high concentration of not less than $5.0\times10^{19}$ $cm^{-3}$ and not more than $5.0\times10^{20}$ $cm^{-3}$ and having a thickness of not less than 26 nm and not more than 60 nm, the contact resistance could be reduced to approximately $3.0\times$ $10^{-4}$ cm² with good reproducibility. The present inventors also discovered that the p-side electrode should be formed of Ag, Pt, Mo or Pd and could be formed of an alloy of Ag, Pt, Mo or Pd and Mg or Zn. We further discovered that if the p-type contact layer had a thickness of more than 26 nm, the contact resistance could be reduced sufficiently. And the present inventors discovered that if the p-type contact layer had a thickness of 60 nm or less, it was possible to prevent the bulk resistance of the p-type contact layer itself from increasing so much as to interfere with injection of current.

The present inventors paid special attention to the fact that if the p-type contact layer was thick, then the bulk resistance increased so much as to reduce injection of current, and thought that current to be injected into those dislocations would be reduced by locally increasing the thickness of the p-type contact layer only at and around the dislocations. For example, if the p-type contact layer is selectively grown to have a thickness of 60 nm or more only at and around the dislocations, then the resistance increases only at and around the dislocations and the amount of current to be injected into those dislocations and surrounding regions can be reduced.

Such a p-type nitride semiconductor layer, of which the growing plane (principal surface) is either a non-polar plane or a semi-polar plane, often has surface topography. It is not quite clear exactly how such surface topography is formed but probably addition of a p-type dopant such as magnesium (Mg), beryllium (Be) or zinc (Zn) would play an important role in forming such topography. The shape of the surface topography varies slightly according to the plane orientation of the growing plane (principal surface) but such topography is typically observed as pyramidal hillocks. As for characteristic pyramidal hillocks to be observed when a non-polar m-plane is the growing plane, relations between their size, shape, density and crystal axes are reported in detail in Applied Physics Letters Vol. 91 191906 (2007).

In Japanese Laid-Open Patent Publication No. 2010-219376, the surface topography is called "pyramidal projections". Japanese Laid-Open Patent Publication No. 2010-219376 says "we discovered that if a p-type nitride semiconductor thin film was deposited at a deposition temperature Tg of less than 900 degrees Celsius (i.e., Tg<900 degrees Celsius) when a nitride semiconductor substrate having a non-polar or semi-polar plane was used, the lateral growth of the p-type nitride semiconductor thin film could be prevented effectively". Japanese Laid-Open Patent Publication No. 2010-219376 also says "the p-type nitride semiconductor thin film is suitably deposited at a temperature of not less than 600 degrees Celsius and not more than 880 degrees Celsius. The reason is that if the semiconductor thin film were deposited at a temperature of less than 600 degrees Celsius, a lot of pyramidal projections would be formed on the growing plane, thus making the thickness of the p-type nitride semiconductor thin film non-uniform and generating non-uniform injection of current into the active layer . . . . The lower the deposition temperature, the greater the number of those pyramidal projections formed. But by depositing the nitride semiconductor thin film at a temperature of 600 degrees Celsius or more, it is possible to prevent such pyramidal projections from being formed". The inventors of Japanese Laid-Open Patent Publication No. 2010-219376 think it is a problem that those pyramidal projections (surface topography) are formed on the growing plane and maintains that it is important to deposit the nitride semiconductor thin film at a temperature of more than 700 degrees Celsius to reduce the number of those pyramidal projections.

Likewise, Japanese Patent No. 4375497 also cites a drawing representing the surface morphology of a p-type nitride semiconductor layer as an example of a surface that does not have good planarity (see FIG. 14 of Japanese Patent No. 4375497).

As can be seen, it has been known recently that pyramidal hillocks are often formed on the p-type nitride semiconductor layer, of which the growing plane is either a non-polar plane or a semi-polar plane, thus creating surface topography there in many cases. In each of those patent documents, however, that surface topography is regarded as a factor causing a decrease in surface planarity or non-uniform injection of current.

In contrast, the basic idea of this embodiment lies in taking advantage of the surface topography, which is characteristic of such a non-polar plane or semi-polar plane growth, by controlling its spontaneous generation so that the surface topography can be formed intentionally. That is to say, according to this embodiment, by controlling the process of forming the LED structure so that such projections of the surface topography are formed substantially around those defective portions as centers, the p-type contact layer is locally thickened only at and around those dislocations. At those thickened portions of the p-type contact layer, the resistance is so high that current is not injected as easily as in the other relatively thin portions of the p-type contact layer. Consequently, the amount of current injected into those portions around the dislocations where there are a lot of non-radiative centers can be reduced and the decrease in luminous efficacy can be minimized.

The present inventors discovered that if silicon (Si) was added together with a p-type dopant such as Mg to a p-type nitride semiconductor layer, the thickness of the p-type nitride semiconductor layer (p-type contact layer) could be increased only in a portion surrounding dislocations such as threading dislocations or screw dislocations.

An LED structure is ordinarily formed by depositing an n-type nitride semiconductor layer, an active layer and a p-type nitride semiconductor layer in this order on a substrate. The p-type nitride semiconductor layer may include a p-type contact layer at its top surface. Thus, in this description, the "p-type nitride semiconductor layer" may include a p-type contact layer at its top surface unless otherwise stated. Not only a p-type dopant such as Mg, Be or Zn but also Si may be added to the p-type nitride semiconductor layer. As a result, only the defective portions having threading dislocations or screw dislocations and their surrounding portions can have a greater thickness than elsewhere at a low cost.

According to this embodiment, the thickness of the p-type nitride semiconductor layer can be increased locally around the dislocations such as threading dislocations or screw dislocations. However, it is not quite clear exactly how this phenomenon happens. Nevertheless, it is known that Si to be added functions as an anti-surfactant. That is why probably due to the local presence of Si at and around those dislocations, the growth rate of the p-type nitride semiconductor layer would increase only at and around the dislocations, thus resulting in a local increase in thickness only at and around the dislocations. It should be noted that such a selective increase in thickness at and around the dislocations is not caused easily if there is no p-type dopant. For that reason, a p-type dopant may be added along with Si. If the p-type nitride semiconductor layer (p-type contact layer) is grown so as to be locally thickened at and around those defective portions, the growing plane comes to have surface topography. In the following description, those locally thickened portions of the surface topography will be referred to herein as "projections", no matter what shape those portions have.

For example, the concentration of Si may be not less than $1.0 \times 10^{17}$ cm$^{-3}$ and not more than $6.0 \times 10^{17}$ cm$^{-3}$. Even though Si is an n-type dopant, its influence on p-type carriers can be reduced by setting the Si concentration to be $6.0 \times 10^{17}$ cm$^{-3}$ or less. Also, by setting the Si concentration to be $1.0 \times 10^{17}$ cm$^{-3}$ or more, projections can be formed more appropriately.

Si may be added when the p-type nitride semiconductor layer starts to be grown, for example. Then, projections can be formed only at and around the dislocations with good reproducibility. For instance, Si may start to be supplied when the p-type nitride semiconductor layer starts to be deposited. Alternatively, Si may also start to be supplied when the thickness of the p-type nitride semiconductor layer deposited is within 30 nm. Still alternatively, Si may also start to be supplied when the thickness of the p-type nitride semiconductor layer deposited is within 50 nm. In any case, Si may be added continuously while the p-type nitride semiconductor layer is being deposited. But addition of Si may be stopped when the thickness of the p-type nitride semiconductor layer deposited is within 100 nm. In that case, the electrical characteristic of the p-type nitride semiconductor layer can be controlled more easily. Also, if the thickness at which Si is added is 10 nm or more, then those projections can be formed with good reproducibility.

For example, if the p-type nitride semiconductor layer includes a p-AlGaN electron blocking layer 106 (shown in FIG. 7) or an overflow suppressing layer, then Si may be added when these layers start to be grown. Also, if the p-type nitride semiconductor layer includes a p-GaN layer 107 and a p-GaN contact layer 108, then Si may be added when these layers start to be grown.

Optionally, an undoped layer may be provided as an intermediate layer between the p-type nitride semiconductor layer and the active layer. The p-type layer to be formed after the supply of Si is stopped may have a thickness of 500 nm or less. Then, it is possible to prevent projections that have been once formed from disappearing.

Even if a growth process needs to be carried out at too high a temperature to form projections unless the method of this embodiment is adopted, projections can also be formed on the top surface of the p-type nitride semiconductor layer by adopting the method of this embodiment.

The growing temperature of the p-type nitride semiconductor layer may be 800 degrees Celsius or more, for example. In that case, the resistivity can be prevented from increasing due to a low growing temperature. Particularly when the growing process is carried out so that the concentration of Mg included in the p-type nitride semiconductor layer falls within the range of not less than $3.0 \times 10^{18}$ cm$^{-3}$ and not more than $3.0 \times 10^{19}$ cm$^{-3}$, the resistivity can be prevented from increasing due to a low growing temperature.

Japanese Laid-Open Patent Publication No. 2010-219376 says that if a p-type nitride semiconductor layer is grown at a low temperature, pyramidal projections will be formed easily on the top surface, and also says that if a p-type nitride semiconductor layer is grown at as high a temperature as 700 degrees Celsius or more, spontaneous formation of pyramidal projections can be reduced. It should be noted that when a p-type nitride semiconductor layer is grown at a low temperature, the surface topography (pyramidal projections) is not formed selectively only at and around dislocations. In addition, in the prior art, those pyramidal projections each have so large a bottom area that a single pyramidal projection covers a lot of dislocations, and therefore, will not reduce injection of current into those dislocations selectively.

In contrast, according to this embodiment, just by adding Si when the p-type nitride semiconductor layer (or respective layers that form the p-type nitride semiconductor layer) starts to be deposited, the projections can be formed locally only at and around those dislocations. In addition, even if the p-type nitride semiconductor layer is grown at as high a temperature as 800 degrees Celsius or more, not only can projections be formed on the surface but also can good resistivity be achieved as well.

By adopting this embodiment, the p-type nitride semiconductor layer can have its thickness increased selectively and locally only at its defective portions and surrounding portions. However, the location of some portion of the p-type nitride semiconductor layer having the greatest thickness (i.e., the center of a projection) does not exactly agree with that of a dislocation. Even so, the dislocation can still be located very close to that portion of the p-type nitride semiconductor layer having the greatest thickness (i.e., the center of a dislocation), and therefore, the effect of this embodiment of the present disclosure can still be achieved with no problem at all.

Figure 5C:
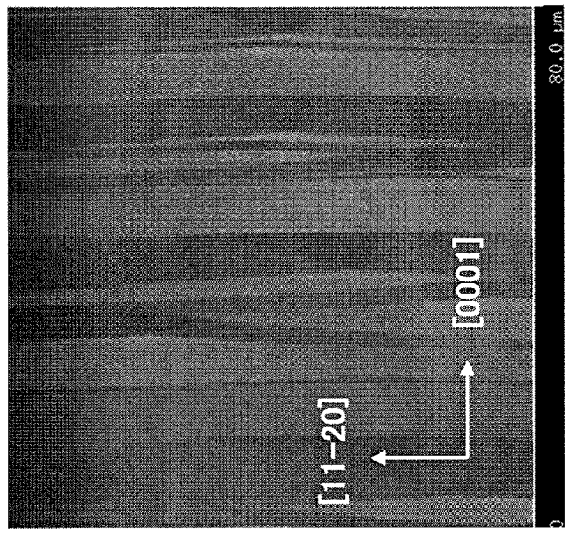
FIGS. 5A through 5C are AFM (atomic force microscope) images showing the surface of a semiconductor layer according to an embodiment.
Figure 5B:
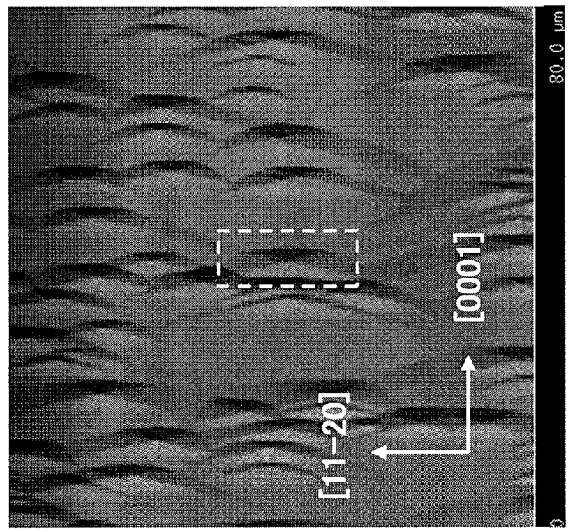
Figure 5A:
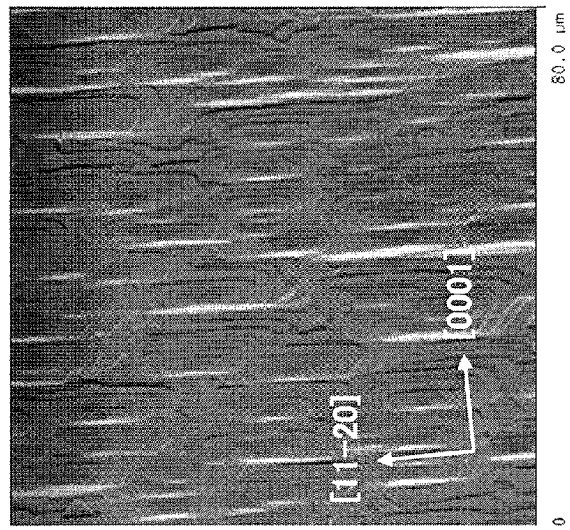

FIGS. 5A through 5C show surface AFM differential images (80×80 µm) of samples, of which the p-type nitride semiconductor layer was formed with the growing temperature changed according to this embodiment. A p-type contact layer having a thickness of 30 nm had been formed at the top surface of the p-type nitride semiconductor layer. And the AFM differential images shown in FIGS. 5A through 5C represent the surface morphologies of the p-type contact layer.

In the samples shown in FIGS. 5A, 5B and 5C, their p-type nitride semiconductor layer was grown at temperatures of 790 degrees Celsius, 890 degrees Celsius and 1025 degrees Celsius, respectively. In each of these samples, an n-type nitride semiconductor layer, a p-type nitride semiconductor layer and a p-type contact layer were deposited in this order on a GaN self-standing substrate, of which the growing plane (principal surface) was an m-plane as a non-polar plane. However, the p-type contact layer just included Mg as a p-type dopant at a higher concentration than the rest of the p-type nitride semiconductor layer, and there was no distinct difference as a layer between the p-type contact layer and the rest of the p-type nitride semiconductor layer other than the p-type contact layer. The n-type nitride semiconductor layer was grown at a temperature of 1070 degrees Celsius. After that, the temperature of the substrate was lowered to each sample's own setting, and then the p-type nitride semiconductor layer started to be grown after a sufficient amount of standby time. To each of the samples shown in FIGS. 5A, 5B and 5C, Si was added at the same rate only right after the p-type nitride semiconductor layer had started to be deposited. However, the present inventors confirmed through SIMS (secondary ion mass spectroscopy) analysis that Si had been added to only the first 30 nm thickness range of the p-type nitride semiconductor layer and its concentration was even at $3.0 \times 10^{17}$ cm$^{-3}$ within that 30 nm thickness range.

As for the samples shown in FIGS. 5A and 5B, it can be confirmed that projections were formed on their surface, even though their shapes were different from each other. When measured based on the images shown in FIGS. 5A and 5B, and other AFM images (not shown), projections were typically present at a density of not less than $1.0 \times 10^5$ cm$^{-2}$ and not more than $1.0 \times 10^7$ cm$^{-2}$, which agreed with the density of dislocations in the GaN self-standing substrate used. Also, although Japanese Laid-Open Patent Publication No. 2010-219376 says that spontaneous generation of pyramidal projections can be reduced at a temperature of 700 degrees Celsius or more, projections can be formed intentionally according to this embodiment on the surface even if the growing process is carried out at as high a temperature as 890 degrees Celsius as shown in FIG. 5B. However, as shown in FIG. 5C, even if Si was added, no projections could be formed on the surface when the growing process was carried out at a high temperature of 1025 degrees Celsius. Thus, according to this embodiment, the p-type nitride semiconductor layer may be grown at a temperature of less than 1025 degrees Celsius, for example.

In the samples shown in FIGS. 5A, 5B and 5C, the p-type nitride semiconductor layer had resistivities of 5.2 Ωcm, 1.0 Ωcm, and 0.9 Ωcm, respectively. Thus, according to this embodiment, by setting the growing temperature to be around 890 degrees Celsius, projections could be formed selectively only at and around the dislocations so as to reduce the resistivity of the p-type nitride semiconductor layer sufficiently to approximately 1.0 Ωcm. The present inventors discovered and confirmed via experiments that by setting the concentration of Si added to fall within the range of not less than $1.0 \times 10^{17}$ cm$^{-3}$ and not more than $6.0 \times 10^{17}$ cm$^{-3}$ and the growing temperature of the p-type nitride semiconductor layer to be 850 degrees Celsius or more, a sufficiently large number of projections could be formed and the resistivity could be reduced to 2.0 Ωcm or less. It should be noted that at a growing temperature at which the p-type nitride semiconductor layer had a resistivity of 2.0 Ωcm or less just as intended, typically pyramidal projections such as the ones shown in FIG. 5B were observed.

As for each of the projections shown in FIG. 5A or 5B, as a result of the TEM analysis that was carried out with the center of the projection targeted on, the present inventors discovered that a dislocation such as a threading dislocation or screw dislocation was located substantially at the center of the projection. FIGS. 10A and 10B show an exemplary result of the TEM analysis that was carried out on a sample provided by the present inventors with the center of the projection targeted on. According to the TEM analysis such as the one shown in FIGS. 10A and 10B, it is a matter of resolution and difficult to determine whether or not a dislocation is located exactly at the center of a projection. In any case, however, it can be said that the dislocation should be located in the vicinity of the center of the projection to say the least.

As shown in FIG. 10B, when dislocations are exposed on the surface of a projection (i.e., the growing plane of the p-type nitride semiconductor layer), sometimes vacancies may be formed. In that case, a portion of the projection located at the edge of a dislocation (vacancy) has a local maximum height in that projection. In other words, that portion of the projection at the edge of a dislocation (vacancy), i.e., in the vicinity of the dislocation, is located at a higher level than the region surrounding that portion. In that projection, its height decreases with increase in the distance from the center.

In FIG. 5A, the height decreased gradually with increase in the distance from the center of the projection. In FIG. 5B, on the other hand, the height decreased substantially continuously. In any case, however, the p-type contact layer comes to have a local maximum thickness at and around a dislocation where there are a lot of non-radiative centers (i.e., at substantially the center of the projection), and therefore, the effect of reducing current injection can be achieved.

As described above, if the thickness of the p-type contact layer is greater than 60 nm, the resistivity increases. That is why if the projection can be formed so that the thickness of the p-type contact layer is greater than 60 nm only at and around a dislocation, current will not be injected easily into that portion at and around the dislocation, thus resulting in non-uniform injection of current. The present inventors discovered via experiments that in a situation where the concentration of Si to be added when the p-type nitride semiconductor layer started to be deposited was adjusted to fall within the range of not less than $1.0 \times 10^{17}$ cm$^{-3}$ and not more than $6.0 \times 10^{17}$ cm$^{-3}$ and the concentration of Mg in the p-type contact layer was adjusted to fall within the range of not less than $5.0 \times 10^{19}$ cm$^{-3}$ and not more than $5.0 \times 10^{20}$ cm$^{-3}$, if the rest of the p-type nitride semiconductor layer other than the p-type contact layer was deposited to a thickness of approximately 100 to 200 nm and if the p-type contact layer was deposited right on it to a thickness of approximately 30 to 40 nm, the height of the projections of the p-type contact layer (i.e., the level difference of the surface topography) was typically in the range of approximately 30 to 50 nm. Consequently, the thickness of the p-type contact layer at and around a dislocation which is located substantially at the center of a projection can be typically 60 nm or more, and decrease in luminous efficacy can be minimized by reducing the amount of current injected into such a region where there are a lot of non-radiative centers.

Figure 6:
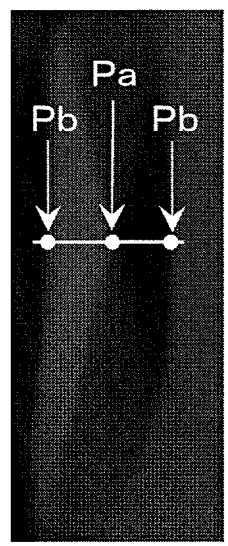
FIG. 6 shows, on a larger scale, the portion indicated by the white dotted rectangle in FIG. 5B.

The height of the projection (i.e., the level difference of the surface topography) can be measured using an AFM or a laser microscope. In this description, the height of a projection is defined to be the difference in height between the center of the projection and a point at the foot of the projection where the surface starts to get inclined with respect to the growing plane of the p-type nitride semiconductor layer. FIG. 6 is an enlarged view of the projection indicated by the dotted rectangle in FIG. 5B. Of the three points Pa and Pb shown in FIG. 6, the central point Pa indicates the center of the projection, while the two other points Pb on both sides of the point Pa indicate the points at the foot where the surface starts to get inclined. The height of the projection is the difference in height between the central point Pa and any of the two points Pb on both sides.

The height of the projection varies according to the condition for growing the p-type nitride semiconductor layer and the thickness of the p-type nitride semiconductor layer deposited. Particularly, the concentration of the p-type dopant has significant influence. Specifically, if the concentration of Mg in the p-type nitride semiconductor layer falls within the range of not less than $3.0 \times 10^{18}$ cm$^{-3}$ and not more than $3.0 \times 10^{19}$ cm$^{-3}$, the projection can be formed but a level difference of about 10 to 20 nm is created while the p-type nitride semiconductor layer is being deposited to a thickness of 100 to 200 nm. On the other hand, in the p-type contact layer including Mg at a concentration of not less than $5.0 \times 10^{19}$ cm$^{-3}$ and not more than $5.0 \times 10^{20}$ cm$^{-3}$, a level difference of about 20 to 30 nm is created while the p-type contact layer is being deposited to a thickness of 30 to 40 nm.

According to this embodiment, the p-type contact layer is selectively thickened only at and around the dislocations to reduce injected current locally. That is to say, this embodiment is designed so as to cause non-uniform injection of current into an LED intentionally. That is why if the total area where the projections are formed substantially around the dislocations as centers were too broad, then the areas where the p-type contact layer is thickened would form a majority and the LED would require an excessively high operating voltage because current could not be injected easily overall. For that reason, the smaller the area of each projection, the better. The results of experiments carried out by the present inventors revealed that the area defined by tracing the foot of each single projection (i.e., the area of the projection on a plan view) should fall within the range of not less than $5.0 \times 10^{-7}$ cm² and not more than 3.8×10⁻⁶ cm². The reason is that if the area of each single projection is equal to or greater than 5.0×10⁻⁷ cm², the projection has a sufficient height and the effect of reducing current to be injected into a dislocation and its surrounding portion can be achieved significantly. If the area of each single projection is equal to or smaller than 3.8×10⁻⁶ cm², increase in operating voltage can be minimized.

In an embodiment of the present disclosure described above, projections of the shape shown in FIGS. 5A through 5C are supposed to be used. However, according to this embodiment, as long as the p-type contact layer is intentionally thickened locally at and around threading dislocations, screw dislocations and other dislocations inherited from the substrate, the projections themselves do not have to have the shapes shown in FIGS. 5 and 6. That is why the projections do not have to be the pyramidal hillocks such as the ones shown in FIG. 5B but the bottom of each of those projections may have a substantially square shape, a substantially rectangular shape, a substantially circular shape, a substantially elliptical shape or any other shape as long as the shape is substantially centered around the dislocation. It should be noted that the "substantially square shape" and the "substantially rectangular shape" include square and rectangular shapes with rounded corners or shapes of which the sides are not lines but curves. Also, the "substantially circular shape" and "substantially elliptical shape" include deformed shapes. In the foregoing description, Mg is supposed to be used as a p-type dopant. However, any other p-type dopant such as Be or Zn may also be used.

Embodiment 1

Hereinafter, a nitride semiconductor light-emitting element 401 (hereinafter, referred to as a "light-emitting element 401") according to a first embodiment of the present disclosure and a method of fabricating the light-emitting element 401 will be described with reference to FIGS. 7 and 11.

Figure 7:
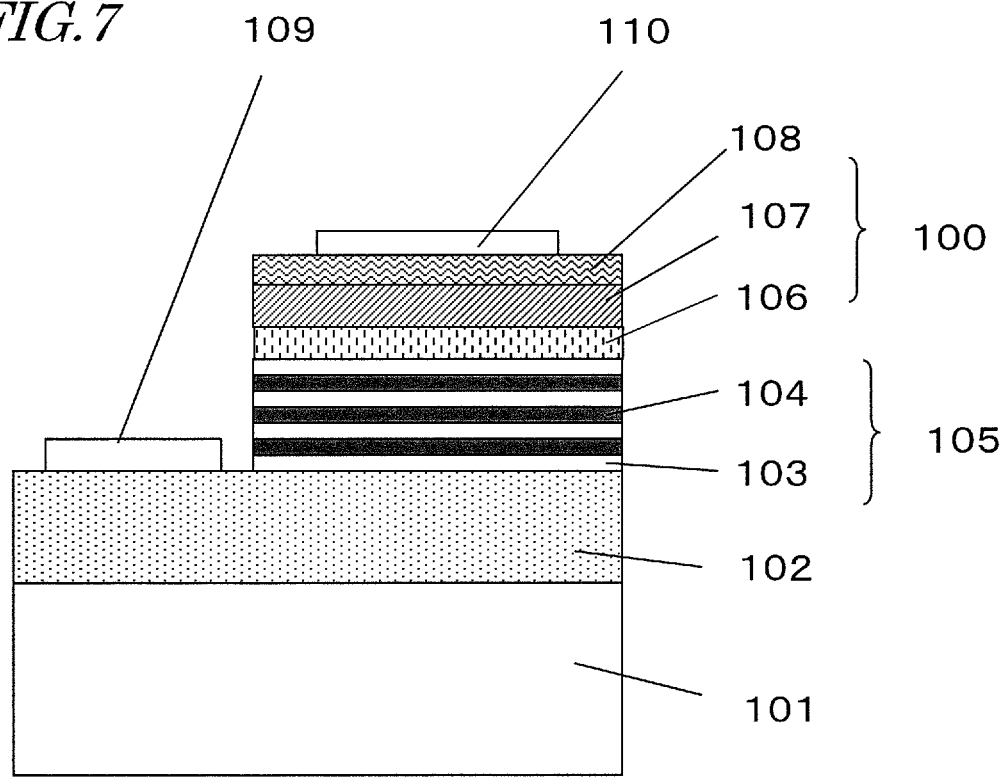
FIG. 7 is a schematic representation illustrating a configuration for a light-emitting element according to an embodiment.

FIG. 7 is a cross-sectional view illustrating the light-emitting element 401 according to the first embodiment. The light-emitting element 401 is fabricated to include a crystal-growing substrate 101, an n-GaN layer (n-type nitride semiconductor layer) 102, a p-type nitride semiconductor layer 100, and a multi-quantum well active layer 105 which is located between the n-GaN layer 102 and the p-type nitride semiconductor layer 100. The layer 102 is supported on the substrate 101. A p-side electrode 110 is arranged on the p-type nitride semiconductor layer 100. And an n-side electrode 109 is arranged on the n-GaN layer 102.

The growing plane (principal surface) of the substrate 101 is either a non-polar plane or a semi-polar plane, so is the growing plane of the p-type nitride semiconductor layer 100. Optionally, the substrate 101 may be removed after the crystal growing process is over.

The growing plane of the p-type nitride semiconductor layer 100 has a plurality of dislocations and a plurality of projections which are arranged at those dislocations and at which the thickness of the p-type nitride semiconductor layer 100 is locally increased. For example, a single dislocation may be located substantially at the center of a single projection. A single dislocation may be present by itself. Or a plurality of dislocations may form a set of dislocations. In the latter case, each set of dislocations is separated from the other dislocations by a region of the p-type nitride semiconductor layer 100 where there are no dislocations. Those dislocations that form each set of dislocations may be branches of a single dislocation. On the growing plane of the p-type nitride semiconductor layer 100, those dislocations may be dotted ones or linear ones or may have some area.

Each dislocation may be exposed on the growing plane of the p-type nitride semiconductor layer 100. In that case, on the growing plane of the p-type nitride semiconductor layer 100, those projections are arranged so as to surround the dislocation.

In this embodiment, the "p-type nitride semiconductor layer 100" includes a p-AlGaN electron blocking layer 106, a p-GaN layer 107 and a p-GaN contact layer 108. Optionally, the p-type nitride semiconductor layer 100 may further include an Si-doped layer 111 on the end closer to the multi-quantum well active layer 105. The Si-doped layer 111 has a thickness of not less than 10 nm and not more than 100 nm and includes Si at a concentration of not less than $1.0 \times 10^{17}$ cm⁻³ and not more than $6.0 \times 10^{17}$ cm⁻³. The Si-doped layer 111 may be thinner than the p-AlGaN electron blocking layer 106 and may be included in its entirety in the p-AlGaN electron blocking layer 106. Alternatively, the Si-doped layer 111 may be as thick as, and may be the same as, the p-AlGaN electron blocking layer 106. Still alternatively, the Si-doped layer 111 may be thicker than the p-AlGaN electron blocking layer 106 and the p-AlGaN electron blocking layer 106 may be included in its entirety in the Si-doped layer 111.

By setting the thickness of the Si-doped layer 111 to be 10 nm or more, projections can be formed with good reproducibility. Also, by setting the thickness of the Si-doped layer 111 to be 100 nm or less, the electrical characteristic of the p-type nitride semiconductor layer can also be controlled toward an intended value even if Si is added as an n-type dopant.

Even though a GaN-based self-standing substrate, of which the growing plane (principal surface) is either a non-polar plane or a semi-polar plane, is supposed to be used as the substrate 101, this is only an example. Alternatively, an SiC substrate or sapphire substrate, on which a nitride semiconductor layer of which the principal surface is a non-polar or semi-polar plane has been formed, may also be used. The effect of this embodiment can be achieved as long as the active layer and p-type nitride semiconductor layer of the LED structure are nitride semiconductor layers, of which the growing plane (principal surface) is a non-polar or semi-polar plane.

The nitride semiconductor to form the multi-quantum well active layer 105 and other layers was deposited by MOCVD (metalorganic chemical vapor deposition) method. First of all, the substrate 101 was washed with a buffered hydrofluoric acid (BHF) solution, rinsed with water, and then dried sufficiently. The substrate 101 that had been washed in this manner was transported to the reaction chamber of an MOCVD system in such a manner that its exposure to the air was avoided as successfully as possible. Thereafter, while only ammonia (NH₃) gas was supplied as a nitrogen source gas, the substrate was heated to 850 degrees Celsius to clean the surface of the substrate.

Next, while a trimethylgallium (TMG) gas and a silane (SiH₄) gas were supplied, the substrate was heated to about 1100 degrees Celsius to deposit an n-GaN layer 102. The silane gas is the source gas of Si as an n-type dopant.

Next, the supply of the SiH₄ gas was stopped, the temperature of the substrate was lowered to less than 800 degrees Celsius, and trimethylindium (TMI) gas started to be supplied to form an $In_yGa_{1-y}N$ (where 0≤y<1) barrier layer 103. In addition, an $In_xGa_{1-x}N$ (where 0≤y<x<1) well layer 104 was also deposited. By alternately forming the $In_yGa_{1-y}N$ (where 0≤y<1) barrier layers 103 and $In_xGa_{1-x}N$ (where 0≤y<x<1) well layers 104 in two or more cycles, a multi-quantum well active layer 105 that will emit light was formed. In this case, these layers were formed in two or more cycles, because the larger the number of the $In_xGa_{1-x}N$ (where $0 \leq y < x < 1$) well layers 104, the more perfectly an excessive increase in the carrier density in the well layer can be avoided when the device is driven with a large current, the more significantly the number of carriers overflowing out of the active layer can be reduced, and eventually the better the performance of the element can be. The $In_xGa_{1-x}N$ (where $0 \leq y < x < 1$) well layer 104 was deposited by adjusting the growing time so that the layer would have a thickness of not less than 6 nm and not more than 20 nm. On the other hand, the $In_yGa_{1-y}N$ (where $0 \leq y \leq 1$) barrier layer 103 to separate the $In_xGa_{1-x}N$ (where $0 \leq y < x < 1$) well layer 104 was deposited by adjusting the growing time so that the layer would have a thickness of not less than 6 nm to not more than 40 nm.

FIG. 11A shows a surface optical microscopic image and a schematic cross-sectional view of a sample which was unloaded from the reaction chamber after the crystal-growing process was stopped at this stage. In the schematic cross-sectional view shown in FIG. 11A, the scale of the lateral width is approximately 20 µm, but the scale in the crystal growing direction is exaggerated. Even though large pyramidal hillocks were formed on the surface, their density of generation was low and did not agree with the density of threading dislocations, screw dislocations and other dislocations which had already been generated in the substrate 101 at a density of not less than $1.0 \times 10^5$ cm$^{-2}$ and not more than $1.0 \times 10^7$ cm$^{-2}$. The present inventors discovered that projections corresponding individually to those dislocations that had already been generated in the substrate 101 were not generated yet at this stage.

After the multi-quantum well active layer 105 had been deposited, the supply of the TMI gas was stopped and the hydrogen gas started to be supplied again as a carrier gas, in addition to the nitrogen gas. Furthermore, the growing temperature was raised to the range of 800 degrees Celsius to 1000 degrees Celsius, and trimethylaluminum (TMA) and Cp$_2$Mg, which is a source gas of Mg as a p-type dopant, were supplied to form a p-AlGaN electron blocking layer 106 having a thickness of 10 nm to 30 nm.

In this manner, an Al-containing layer such as the AlGaN electron blocking layer 106 may be formed within 100 nm as measured from the end closer to the multi-quantum well active layer 105. As a result, the number of electrons overflowing out of the multi-quantum well active layer 105 can be reduced and those electrons can produce radiative recombination efficiently in the multi-quantum well active layer 105.

When the p-AlGaN electron blocking layer 106 was deposited, a very small amount of SiH$_4$ was supplied to add Si to the p-AlGaN electron blocking layer 106. In this process step, the supply rate of SiH$_4$ was adjusted so that the concentration of Si in the p-AlGaN electron blocking layer 106 would fall within the range of not less than $1.0 \times 10^{17}$ cm$^{-3}$ and not more than $6.0 \times 10^{17}$ cm$^{-3}$. By supplying Si, projections can be formed on the surface of the p-GaN layer 107 and p-GaN contact layer 108 to be deposited thereon.

FIG. 11B shows a surface optical microscopic image and a schematic cross-sectional view of a sample which was unloaded from the reaction chamber after the crystal-growing process was stopped at this stage. In the schematic cross-sectional view shown in FIG. 11B, the scale of the lateral width is approximately 20 µm, but the scale in the crystal growing direction is exaggerated. In the sample shown in FIG. 11B, the p-AlGaN electron blocking layer 106 was deposited to a thickness of approximately 20 nm. The present inventors discovered that in the sample shown in FIG. 11B, not only those large pyramidal hillocks such as the ones shown in FIG. 11A but also very small projections had started to be formed on the surface. The present inventors also discovered that those very small projections often had a level difference of 10 nm or less and that it was difficult to determine whether projections had been formed at all or not as for some of those projections with not so significant level differences.

Next, the supply of TMA was stopped to form a p-GaN layer 107. Furthermore, the rate of supplying Cp$_2$Mg was increased to deposit a p-GaN contact layer 108 right on the p-GaN layer 107. By depositing the p-GaN layer 107 and p-GaN contact layer 108 to a thickness of 100 to 200 nm and a thickness of 30 to 40 nm, respectively, projections typically having a height of not less than 30 nm and not more than 50 nm can be formed on the top surface of the p-GaN contact layer 108.

FIG. 11C shows a surface optical microscopic image and a schematic cross-sectional view of a sample which was unloaded from the reaction chamber. In the schematic cross-sectional view shown in FIG. 11C, the scale of the lateral width is approximately 20 µm, but the scale in the crystal growing direction is exaggerated. In the sample shown in FIG. 11C, the p-GaN layer 107 was deposited to a thickness of approximately 100 nm and the p-GaN contact layer 108 was deposited to a thickness of approximately 30 nm. That is to say, the h1 value shown in the schematic cross-sectional view of FIG. 11C is 30 nm.

As can be seen from FIG. 11C, projections were formed definitely on the surface. The projections observed had an almost pyramidal shape. Their bottom was substantially rectangular, the longer axis was typically in the range of 10 to 20 µm, and the shorter axis was typically in the range of 5 to 10 µm. The density of the projections thus formed agreed with that of the threading dislocations, screw dislocations and other dislocations that had already been generated in the substrate 101 from the beginning at a density of not less than $1.0 \times 10^5$ cm$^{-2}$ and not more than $1.0 \times 10^7$ cm$^{-2}$. A result of observation of a sectional TEM which was carried out with the vertex of the projections targeted on is shown in FIGS. 10A and 10B.

The level differences (h2−h1) of the respective projections varied slightly but typically fell within the range of 30 nm to 50 nm. Thus, the thickness of the p-GaN contact layer 108 turned out to be 30 nm (h1) when measured distant from the projections but to fall typically within the range of 60 nm to 80 nm (h2) when measured substantially at the centers of the projections.

After the substrate has been unloaded from the reaction chamber, only a predetermined region of the p-GaN contact layer 108, p-GaN layer 107, p-AlGaN electron blocking layer 106 and multi-quantum well active layer 105 is removed by photolithography and etching techniques, for example, to partially expose the n-GaN layer 102. In the region where the n-GaN layer 102 is exposed, an n-side electrode 109 comprised of Ti/Al layers, for example, is formed. The p-side electrode 110 is formed on a p-GaN contact layer 108 on which projections, including threading dislocations, screw dislocations, and other dislocations substantially at their centers and typically having a level difference of 30 nm to 50 nm, have been formed. On the surface of the p-side electrode 110, a surface morphology similar to the one observed on the p-GaN contact layer 108 is also observed. The p-side electrode 110 may be a stack of metal layers such as Pd/Pt.

By performing these process steps, n-type and p-type carriers can be injected and a light-emitting element which emits light at an intended wavelength from the multi-quantum well active layer 105 can be obtained.

Figure 12:
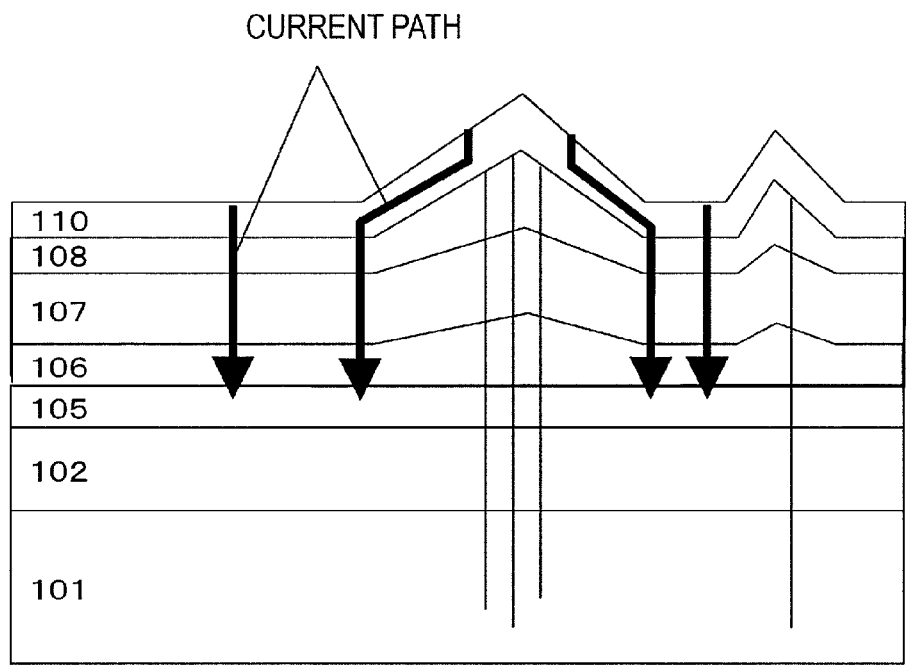
FIG. 12 schematically shows the flow of current in an embodiment.

Due to the presence of those projections that have been formed at and around the dislocations, the p-GaN contact layer 108 is locally thickened (e.g., h2−h1=30 to 50 nm). Since a portion with the projection has a thickness of at least more than 60 nm, the resistivity of that portion increases. That is why as schematically shown in FIG. 12, even if a uniform voltage is applied to the entire plane of the p-side electrode 110, the amount of current injected decreases only at and around those dislocations. As a result, a decrease in luminous efficacy due to the presence of non-radiative centers in the vicinity of the dislocations can be minimized.

Optionally, an undoped GaN spacer layer having a thickness of 100 nm or less may be formed between the multiple quantum well active layer 105 and the p-AlGaN electron blocking layer 106.

Si does not have to be added to the entire p-AlGaN electron blocking layer 106. If the p-AlGaN electron blocking layer 106 has a thickness of 10 nm to 30 nm as in this embodiment, Si may be added to only a portion of the p-AlGaN electron blocking layer 106 on the end closer to the multi-quantum well active layer 105. For example, if the p-AlGaN electron blocking layer 106 is deposited to a thickness of 30 nm, Si may be added to only the first 20 nm but does not need to be added to the remaining 10 nm. Alternatively, if the p-AlGaN electron blocking layer 106 is deposited to a thickness of 30 nm, Si may be added to the entire p-AlGaN electron blocking layer 106 and then continuously added to a portion of the p-GaN layer 107. In that case, adjustment may be made so that the portion to which Si is added has a thickness of 30 nm to 100 nm. It should be noted that the p-AlGaN electron blocking layer 106 does not always have to be provided. If no p-AlGaN electron blocking layer 106 is provided, then Si may be added when the p-GaN layer 107 starts to be deposited so that its thickness will fall within either the range of not less than 10 nm and not more than 100 nm or the range of not less than 30 nm and not more than 100 nm. Still alternatively, Si may also be added when the p-GaN contact layer 108 starts to be formed. Optionally, an overflow suppressing layer may be formed between the multi-quantum well active layer 105 and the p-GaN layer 107. In that case, Si may be added when the overflow suppressing layer starts to be grown.

If the thickness h1 of the p-GaN contact layer 108 is 30 nm and if the typical level difference (h2−h1) of each projection is less than 30 nm, then the p-GaN contact layer substantially at the center of each projection comes to have a thickness of less than 60 nm. In that case, the effect of increasing the resistivity locally cannot be achieved. That is to say, in such a situation, current will be injected into the dislocations as well as into the other regions, and therefore, those non-radiative centers that are present a lot in the vicinity of the dislocations cannot be avoided and the decrease in luminous efficacy cannot be prevented.

FIG. 8A shows an AFM differential image (80×80 μm) of a sample which was made as a comparative example without adding Si to the p-AlGaN electron blocking layer 106. On the other hand, FIG. 8B shows an AFM differential image (80×80 μm) of a sample of this embodiment which was made by adding Si to the p-AlGaN electron blocking layer 106. FIG. 7 is a graph showing in comparison the respective optical powers of those two samples when the same amount of current was injected to both of them.

The samples shown in FIGS. 8A and 8B were prepared so that the p-AlGaN electron blocking layer 106, p-GaN layer 107, and p-GaN contact layer 108 would grow to target thicknesses of 30 nm, 100 nm, and 30 nm, respectively, at a temperature of 890 degrees Celsius. The concentration of Mg as a p-type dopant was in the range of not less than $3.0 \times 10^{18}$ cm$^{-3}$ and not more than $3.0 \times 10^{19}$ cm$^{-3}$ in the p-AlGaN electron blocking layer 106 and the p-GaN layer 107 and in the range of not less than $5.0 \times 10^{19}$ cm$^{-3}$ and not more than $5.0 \times 10^{20}$ cm$^{-3}$ in the p-GaN contact layer 108. The sample in which Si was added to the p-AlGaN electron blocking layer 106 had an Si concentration of 1.5 to $2.0 \times 10^{17}$ cm$^{-3}$.

Comparing FIGS. 8A and 8B to each other, it is clear that even under the same growth condition, the surface looked quite different depending on whether or not Si had been added to the p-AlGaN electron blocking layer 106. As shown in FIG. 8B, when Si was added, projections formed were substantially centered around threading dislocations, screw dislocations and other dislocations. On the other hand, when no Si was added, no projections were formed definitely as can be seen from FIG. 8A. Also, as can be seen from FIG. 9, the sample in which projections were formed intentionally by adding Si thereto had its optical power increased by approximately 10% when current was injected, which is an advantage over the other sample. This is probably because by forming those projections, the amount of current injected into the dislocations could be reduced as schematically shown in FIG. 12, and therefore, decrease in efficiency due to the presence of non-radiative centers in the vicinity of the dislocations would have been minimized.

According to this embodiment, the decrease in luminous efficacy to be caused by inheritance of the threading dislocations, screw dislocations and other dislocations, which had been present in a GaN-based self-standing substrate originally, to the LED structure can be minimized by a simple method. In addition, the same effect can be achieved with respect to misfit dislocations and other dislocations to be generated from the interface of a substrate in a hetero-epitaxial growth. Consequently, even without doing a troublesome job of reducing the dislocation density by subjecting a GaN-based self-standing substrate or a hetero-epitaxial growing substrate to a patterning process in advance, an LED having good luminous efficacy can be obtained with the quantum confinement Stark effect eliminated, which is one of the advantages of an LED, of which the growing plane (principal surface) is a non-polar or semi-polar plane.

Embodiment 2

Hereinafter, a second embodiment will be described with reference to FIG. 13.

The light-emitting element of the first embodiment may be used as a light source unit by itself.

Alternatively, a light-emitting element according to any of the embodiments and modified examples described above and an encapsulating resin including a phosphor that converts the wavelength may be combined with each other. As a result, the emission wavelength range can be expanded and the combination may be used as a white light source unit, for example.

Figure 13:
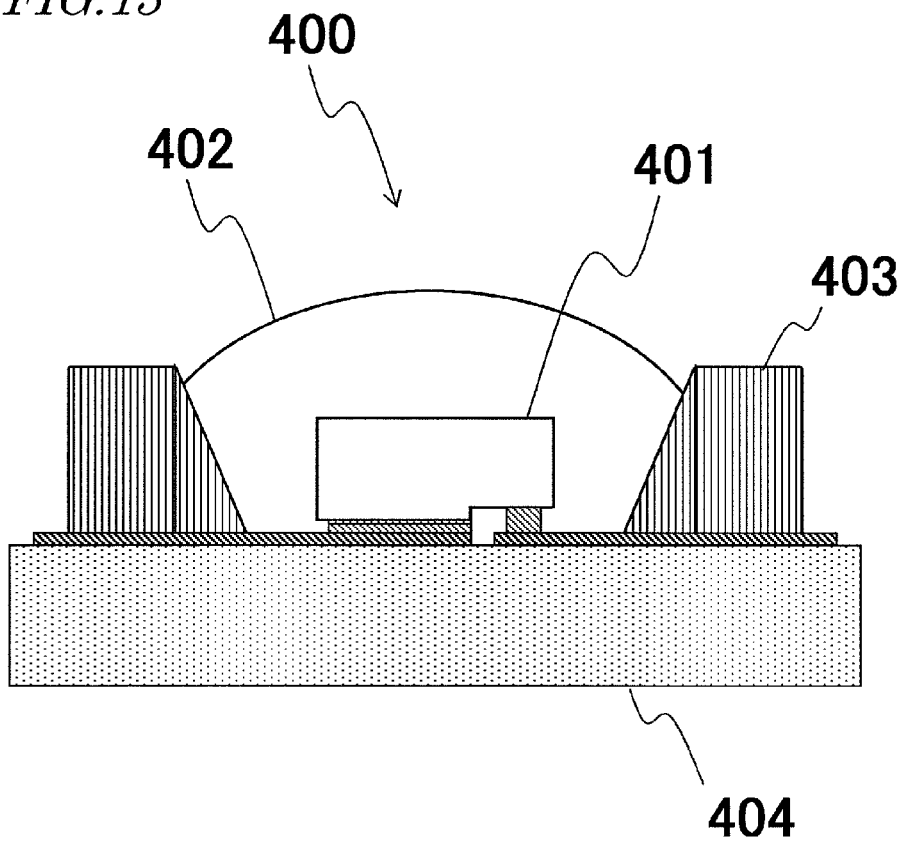
FIG. 13 is a schematic representation illustrating a configuration for a light source unit according to an embodiment.

FIG. 13 illustrates an example of such a white light source unit. As shown in FIG. 13, the white light source unit 400 according to this second embodiment includes the light-emitting element 401 of the first embodiment and a resin layer 402 in which phosphors (such as YAG (yttrium aluminum garnet)) to change the wavelength of the light emitted from the light-emitting element 401 into a longer wavelength are dispersed.

The light-emitting element 401 is mounted on a holding member 404 such as a package on which a wiring pattern has been formed so that its substrate faces upward and its light-emitting layer faces downward, i.e., by so-called "junction down" method. And on the holding member 404, a reflective member 403 of a metal is arranged so as to surround the light-emitting element 401.

The resin layer 402 is arranged to cover the light-emitting element 401 on the holding member 404 and inside the reflective member 403.

As can be seen, according to this third embodiment, a high-efficiency white light source unit 400 can be obtained.

It should be noted that the "m-plane" of an actual nitride semiconductor layer does not always have to be perfectly parallel to an m-plane but may define a predetermined tilt angle with respect to an m-plane. The tilt angle is defined by the angle that is formed between a normal to the principal surface of the nitride semiconductor layer and a normal to the m-plane (which is an m-plane that is not tilted). The principal surface of the actual nitride semiconductor layer may tilt in any of vector directions that are represented by a direction defined by a certain crystallographic orientation such as the c-axis, the a-axis or <11-22> direction with respect to the m-plane (that is not tilted). The absolute value of the tilt angle may be 5 degrees or less, and is suitably 1 degree or less, in the c-axis direction, and may be 5 degrees or less, and is suitably 1 degree or less, in the a-axis direction, too. That is to say, according to the present disclosure, the "m-plane" includes a plane that defines a tilt angle of ±5 degrees or less in a predetermined direction with respect to the m-plane (that is not tilted). If the tilt angle falls within such a range, then the growing plane of the nitride semiconductor layer is tilted overall with respect to the m-plane. However, the former plane should actually include a huge number of m-plane regions exposed, speaking microscopically. That is why planes that are tilted at an angle of 5 degrees or less (which is the absolute value) with respect to an m-plane would have similar properties to those of the m-plane.

Likewise, semi-polar planes such as an r-plane, −r-plane, a (20-21) plane, a (20-2-1) plane, a (10-1-3) plane, and a (11-22) plane and other non-polar planes such as an a-plane would also have similar properties as long as their tilt angle is 5 degrees or less. That is why according to the present disclosure, each of those r, −r, (20-21), (20-2-1), (10-1-3), (11-22) and a planes includes planes that define a tilt angle of ±5 degrees or less in a predetermined direction with respect to that plane itself that is not tilted.

A nitride semiconductor light-emitting element and light source according to an aspect of the present disclosure may be used in a light-emitting device, for example.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A nitride semiconductor light-emitting element comprising:
   an n-side electrode;
   a p-side electrode;
   an n-type nitride semiconductor layer which is electrically connected to the n-side electrode;
   a p-type nitride semiconductor layer having a principal surface that is either a non-polar plane or a semi-polar plane; and
   an active layer which is arranged between the n- and p-type nitride semiconductor layers,
   wherein the p-type nitride semiconductor layer has a projection having a height of not less than 30 nm and not more than 50 nm,
   the projection is formed of a p-type nitride semiconductor including not only magnesium but also silicon,
   the p-type nitride semiconductor has a silicon concentration of not less than $1.0 \times 10^{17}$ cm$^{-3}$ and not more than $6.0 \times 10^{17}$ cm$^{-3}$,
   the projection projects from the active layer toward the p-side electrode,
   on a plan view of the nitride semiconductor light-emitting element, the p-side electrode overlaps with the projection,
   the projection includes a dislocation,
   the projection is surrounded with a flat surface which is formed of the p-type nitride semiconductor, and
   the projection has a higher dislocation density than the flat surface.

2. The nitride semiconductor light-emitting element of claim 1, wherein the projection has a surface area of not less than $5.0 \times 10^{-7}$ cm$^2$ and not more than $3.8 \times 10^{-6}$ cm$^2$.

3. The nitride semiconductor light-emitting element of claim 1, wherein the dislocation density is not less than $1.0 \times 10^5$ cm$^{-2}$ and not more than $1.0 \times 10^7$ cm$^{-2}$.

4. The nitride semiconductor light-emitting element of claim 1, wherein the p-type nitride semiconductor has a magnesium concentration of not less than $5.0 \times 10^{19}$ cm$^{-3}$ and not more than $5.0 \times 10^{20}$ cm$^{-3}$.

5. The nitride semiconductor light-emitting element of claim 1, wherein the projection has a substantially square, substantially rectangular, substantially circular or substantially elliptical cross-sectional shape.

6. The nitride semiconductor light-emitting element of claim 3, wherein on a plan view, a plurality of dislocations are dispersed, and
   wherein the dislocations have a dispersion density of not less than $1.0 \times 10^5$ cm$^{-2}$ and not more than $1.0 \times 10^7$ cm$^{-2}$.

7. The nitride semiconductor light-emitting element of claim 1, wherein the flat surface has a thickness of not less than 26 nm and not more than 60 nm.

8. The nitride semiconductor light-emitting element of claim 1, further comprising a p-type nitride semiconductor multilayer structure, wherein
   the p-type nitride semiconductor multilayer structure comprises:
   a p-type nitride semiconductor electron blocking layer; and
   a p-type nitride semiconductor contact layer,
   the p-type nitride semiconductor electron blocking layer is sandwiched between the active layer and p-type nitride semiconductor contact layer,
   the p-type nitride semiconductor contact layer is sandwiched between the p-side electrode and the p-type nitride semiconductor electron blocking layer, and
   the p-type nitride semiconductor electron blocking layer is the p-type nitride semiconductor layer.

9. The nitride semiconductor light-emitting element of claim 8, wherein another p-type nitride semiconductor layer is sandwiched between the p-type nitride semiconductor electron blocking layer and the p-type nitride semiconductor contact layer.

10. The nitride semiconductor light-emitting element of claim 8, wherein the p-type contact layer has a magnesium concentration of not less than $5.0 \times 10^{19}$ cm$^{-3}$ and not more than $5.0 \times 10^{20}$ cm$^{-3}$, and
    the p-type contact layer has a thickness of not less than 26 nm and not more than 60 nm.

11. The nitride semiconductor light-emitting element of claim 1, wherein the p-type nitride semiconductor layer has an Si-doped layer which is located closer to the active layer, the Si-doped layer has a thickness of not less than 10 nm and not more than 100 nm, and the Si-doped layer has a silicon concentration of not less than $1.0 \times 10^{17}$ cm$^{-3}$ and not more than $6.0 \times 10^{17}$ cm$^{-3}$.

12. The nitride semiconductor light-emitting element of claim 11, wherein the p-type nitride semiconductor layer includes Al within a range of 100 nm as measured from an end of the p-type nitride semiconductor layer closer to the active layer.

13. A light source comprising:

the nitride semiconductor light-emitting element of claim 1; and a wavelength converting section including a phosphor which converts the wavelength of light emitted from the nitride semiconductor light-emitting element.

* * * * *